United States Patent
Billmann et al.

(10) Patent No.: US 8,183,674 B2
(45) Date of Patent: May 22, 2012

(54) POWER SEMICONDUCTOR MODULE COMPRISING AN EXPLOSION PROTECTION SYSTEM

(75) Inventors: Markus Billmann, Emskirchen (DE); Jörg Dorn, Buttenheim (DE)

(73) Assignees: Siemens Aktiengesellschaft, Munich (DE); Fraunhofer Gesellschaft zur Foerderung der Angewandten Forschung E.V., Munich (DE)

( * ) Notice: Subject to any disclaimer, the term of this patent is extended or adjusted under 35 U.S.C. 154(b) by 492 days.

(21) Appl. No.: 12/440,529

(22) PCT Filed: Sep. 14, 2006

(86) PCT No.: PCT/DE2006/001641
§ 371 (c)(1),
(2), (4) Date: Mar. 9, 2009

(87) PCT Pub. No.: WO2008/031372
PCT Pub. Date: Mar. 20, 2008

(65) Prior Publication Data
US 2009/0250799 A1   Oct. 8, 2009

(51) Int. Cl.
*H01L 23/02* (2006.01)
*H01L 23/34* (2006.01)
(52) U.S. Cl. .. 257/683; 257/728; 257/723; 257/E23.194
(58) Field of Classification Search .................. 257/683, 257/E23.194, 728, 723
See application file for complete search history.

(56) References Cited

U.S. PATENT DOCUMENTS

| | | | | |
|---|---|---|---|---|
| 4,150,394 A * | 4/1979 | Sugawa et al. | ................ | 257/689 |
| 4,162,514 A | 7/1979 | De Bruyne et al. | | |
| 4,274,106 A * | 6/1981 | Ohdate | ......................... | 257/683 |
| 4,399,452 A * | 8/1983 | Nakashima et al. | ......... | 257/689 |
| 6,295,205 B1 | 9/2001 | Lang et al. | | |
| 7,221,004 B2 | 5/2007 | Scholz et al. | | |
| 2003/0115976 A1* | 6/2003 | Burkhard | .................... | 73/865.6 |
| 2006/0038268 A1 | 2/2006 | Scholz et al. | | |
| 2007/0231677 A1* | 10/2007 | Stocchiero | ...................... | 429/53 |
| 2008/0100972 A1* | 5/2008 | Magnier | ........................ | 361/37 |

FOREIGN PATENT DOCUMENTS

| | | |
|---|---|---|
| DE | 19839422 A1 | 3/2000 |
| DE | 10306767 A1 | 8/2004 |
| EP | 0033399 A1 | 8/1981 |
| EP | 1768182 A2 | 3/2007 |
| JP | 53053963 A | 5/1978 |
| JP | 2000091455 A | 3/2000 |
| JP | 2000183277 A | 6/2000 |
| JP | 2004095992 A | 3/2004 |
| JP | 2004294025 A | 10/2004 |
| WO | 2004075290 A1 | 9/2004 |

OTHER PUBLICATIONS

European Office Action dated Jul. 27, 2009.
Written Opinion of the International Search Report dated May 16, 2007.
T. Mori, et al: "A new Interruption Method for Low-Voltage, High-Capacity Air-Break Contactors Suppressing the Blowoff of a Hot Gas", Proceedings of the Industry Applications Society Meeting, 1991, IEEE pp. 1692-1698, Dearborn, New York, USA.

* cited by examiner

*Primary Examiner* — Nitin Parekh
(74) *Attorney, Agent, or Firm* — Laurence A. Greenberg; Werner H. Stemer; Ralph E. Locher

(57) ABSTRACT

A power semiconductor module for energy distribution, includes at least one power semiconductor, connection terminals for connecting the power semiconductor module, and a housing, in which protection from explosion is ensured in the module even in the event of electric arcs. Therefore, each power semiconductor and each connection terminal is disposed in the housing, and the housing includes an exhaust gas channel for the controlled withdrawal of hot gases and/or plasma in the event of an explosion.

13 Claims, 2 Drawing Sheets

POWER SEMICONDUCTOR MODULE COMPRISING AN EXPLOSION PROTECTION SYSTEM

BACKGROUND OF THE INVENTION

Field of the Invention

The invention relates to a power semiconductor module for energy distribution comprising at least one power semiconductor, connection terminals for connection of the power semiconductor module, and a housing.

Such a power semiconductor module is already known from DE 98 39 422, which discloses an explosion protection system for semiconductor modules, wherein the semiconductor is arranged in a protective sheathing that captures fragments that are hurled away in the event of an explosion of the power semiconductor. In this way the intention is to prevent persons or adjacent components from being harmed or damaged by the explosion. What is disadvantageous about the previously known power semiconductor component is that the explosion protection system is not suitable for ensuring a sufficient protection when an arc occurs.

BRIEF SUMMARY OF THE INVENTION

It is an object of the invention, therefore, to provide a power semiconductor module of the type mentioned in the introduction which provides explosion protection including when arcs occur.

The invention achieves this object by virtue of the fact that each power semiconductor and each connection terminal are arranged in the housing, wherein the housing has an exhaust gas channel for the controlled carrying away of hot gases and/or plasma in the event of an explosion.

According to the invention, not only the actual power semiconductor is arranged in a component. Rather, all elements of the power semiconductor electronics are arranged in the housing, when the housing itself is also part of the power semiconductor module. The power semiconductor electronics comprise for example all the power semiconductors, that is to say all the controllable power semiconductors and their parallel-connected freewheeling diodes, and also the control units for controlling the power semiconductors. Only the free ends of the connection terminals of the power semiconductor module are led out from the housing in order to connect this to further components, for example to further power semiconductor modules in accordance with the present invention. An arc caused by one of the power semiconductors in the event of a fault therefore arises within the housing and is shielded toward the outside by the housing. In order that the explosion forces and the hot gases that arise are carried away toward the outside in a controlled manner, an exhaust gas channel toward the outside is provided. In this case, the exhaust gas channel is guided in such a way, and its openings are expediently positioned in such a way, that the emerging hot gases or fragments that have been hurled away can damage neither adjacent components nor persons.

Advantageously, the exhaust gas channel is filled with a thermostable filler through which a flow can pass and which has a large internal surface area. By means of this preferred further development of the invention, emerging hot gases or plasma are or is cooled by the filler prior to emerging from the exhaust gas channel. The cooling is all the greater, the greater the internal surface area of the filler. The filler furthermore holds back accelerated particles formed during an explosion in the event of a fault. Furthermore, pressure relief is provided by the filler.

In the case of a further development that is expedient in this regard, the thermostable filler is produced for example from a ceramic. In this case, the ceramic is expediently formed in such a way that a multiplicity of internal channels and continuous pores are provided in it, such that the hot gas or the plasma can still flow through the ceramic. Furthermore, the ceramic is temperature-resistant and also able to withstand the high temperatures that arise during arcing in a manner free of damage to the greatest possible extent.

In one preferred variant of the invention, however, the thermostable filler is a metal foam. Expedient metal foams are commercially available and can be procured as such without any problems. They have a large internal surface area and also a low weight. Furthermore, their thermal capacity is so high and their temperature resistance is sufficient to be able to withstand the high plasma temperatures in the event of arcing. Furthermore, metal foams are durable, such that particles are held back effectively and a particularly high pressure relief is furthermore provided.

In accordance with a further development that is expedient in this respect, the metal foam is an open-pored metal foam. The open pores of the metal foam ensure that there is a sufficient capability for the hot gases and plasma to flow through, with the result that an explosion of the entire housing is effectively prevented.

In a departure from this, the thermostable filler is a metal wool. A metal wool forms a so-called chaotic tangle of metal filaments and is also referred to as a "scouring pad". Metal wool is often used as a flashback arrestor and can be procured more cost-effectively than metal foam, for example.

In the context of the invention, the housing can, in principle, comprise any suitable thermostable housing having sufficient mechanical strength. Expediently, however, the housing is a plastic housing or a metal housing. The plastic of the plastic housing is expediently reinforced by fibers.

The power semiconductors advantageously comprise turn-off power semiconductors. Turn-off power semiconductors can be transferred by an electrical control signal from an off-state position, in which a current flow via the power semiconductor is interrupted, into an on-state position, in which the current flow via the turn-off power semiconductor is enabled. In addition, the transfer of the turn-off power semiconductor from its on-state position into the off-state position can also be brought about actively by means of a control pulse. Turn-off power semiconductors are known as such to the person skilled in the art and are commercially available. Examples of turn-off power semiconductors are IGBTs, IGCTs, GTOs or the like.

In accordance with one preferred exemplary embodiment of the invention, the power semiconductor module has a first connection terminal, a second connection terminal, an energy store arranged outside the housing and a power semiconductor branch connected in parallel with the energy store, said power semiconductor branch having two series-connected controllable power semiconductors, wherein a freewheeling diode that is connected in the opposite sense is connected in parallel with each controllable power semiconductor and the junction point of the emitter of a first controllable power semiconductor of the power semiconductor branch and the anode of the freewheeling diode that is connected in the opposite sense and is assigned to the first controllable power semiconductor forms the first connection terminal and wherein the junction point of the controllable power semiconductors of the power semiconductor branch and the freewheeling diodes forms the second connection terminal. Such a circuit has also become known as a Marquardt circuit. The Marquardt circuit has two switching states, wherein the voltage dropped at the connection terminals is equal to zero in a first switching state and is equal to the voltage of the energy store in a second switching position.

In a departure from this, the power semiconductor module has a first connection terminal, a second connection terminal, an energy store and a power semiconductor branch connected in parallel with the energy store, said power semiconductor branch having two series-connected controllable power semiconductors, wherein a freewheeling diode that is connected in the opposite sense is connected in parallel with each controllable power semiconductor and the junction point of the collector of a first controllable power semiconductor of the power semiconductor branch and the cathode of the freewheeling diode that is connected in the opposite sense and is assigned to the first controllable power semiconductor forms the first connection terminal and the junction point of the controllable power semiconductors of the power semiconductor branch and the freewheeling diode forms the second connection terminal. This is an alternative configuration of the Marquardt circuit, which has essentially the same properties.

The invention furthermore relates to a converter valve branch comprising a series circuit formed by power semiconductor modules as claimed in any of the preceding claims.

Furthermore, the invention relates to a converter comprising a bridge circuit formed by the converter valve branches mentioned above.

In other words, the invention also relates to converters composed of series circuits formed by power semiconductor modules according to the invention. Such converters are also called multilevel converters. They enable the voltages of the individual power semiconductor modules to be turned on and off in a stepwise manner and hence finer and more precise regulation of the voltage.

BRIEF DESCRIPTION OF THE SEVERAL VIEWS OF THE DRAWINGS

Further expedient configurations and advantages of the invention are the subject matter of the following description of exemplary embodiments of the invention with reference to the figures of the drawing, wherein identical reference symbols refer to identically acting components and wherein.

DESCRIPTION OF THE INVENTION

Figure 1:
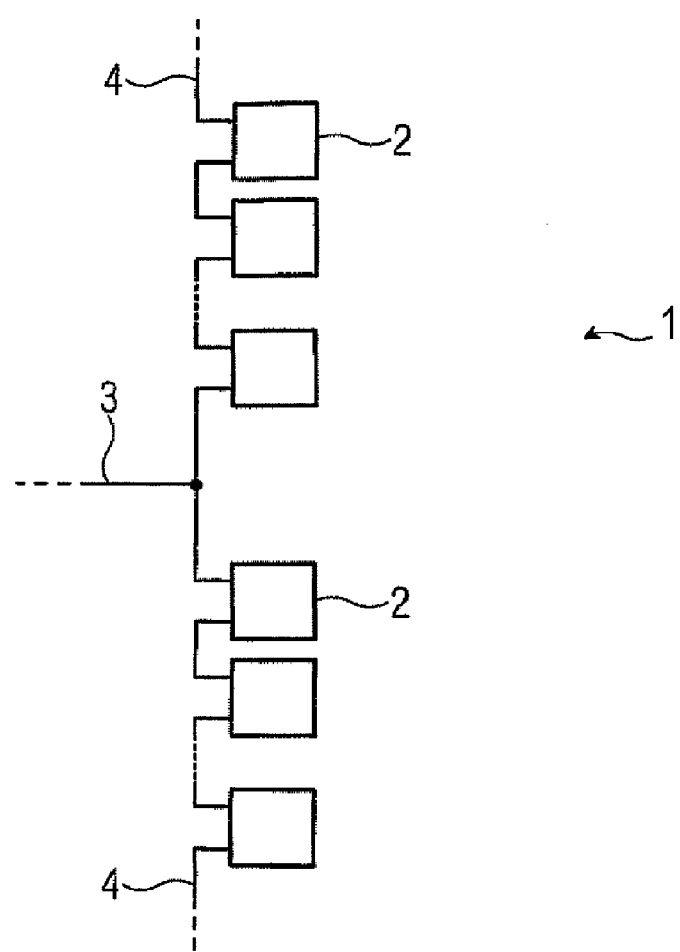
FIG. 1 shows an exemplary embodiment of converter branches according to the invention

FIG. 1 shows an exemplary embodiment of converter branches 1 according to the invention which comprise a series circuit formed by power semiconductor modules 2. In this case, the converter valve branches 1 are arranged in series with one another. The number of power semiconductor modules 2 within a converter valve branch 1 depends on the respective application, in particular on the required voltages. The number can therefore vary between a few tens up to hundreds of power semiconductor modules 2.

An AC voltage connection 3 is provided between the converter valve branches 1 and is provided for connection to a phase of an AC voltage power supply system. A DC voltage connection 4 is provided at that end of each converter valve branch 1 which is remote from the AC voltage connection 3. Consequently, each converter valve branch 1 is arranged between an AC voltage connection 3 and a DC voltage connection 4. In the case of a three-phase AC voltage power supply system to be connected here therefore, an exemplary embodiment of a converter according to the invention would comprise for example six converter valve branches connected up to one another in a bridge circuit that is known as such. This can be a so-called six-pulse bridge circuit or alternatively a twelve-pulse bridge circuit.

Figure 2:
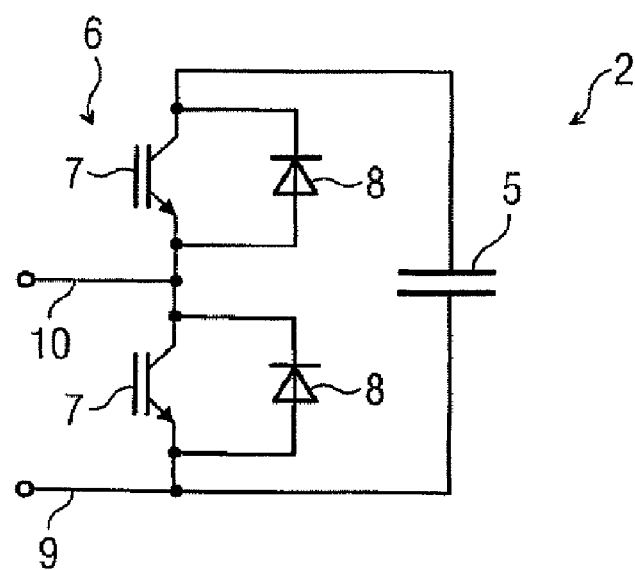
FIG. 2 shows an equivalent circuit diagram of an exemplary embodiment of a power semiconductor module according to the invention.

FIG. 2 shows an equivalent circuit diagram of an exemplary embodiment of a power semiconductor module 2 according to the invention. It can be discerned that each power semiconductor module 2 has an energy store in the form of a capacitor 5. The capacitor 5 is connected in parallel with a power semiconductor branch 6, wherein the power semiconductor branch 6 comprises a series circuit formed by two so-called IGBTs 7. Each IGBT 7 has a freewheeling diode 8 connected in parallel with it in the opposite sense. The component comprising the controllable power semiconductors 7 and the diodes 8 that are connected in the opposite sense together with the control electronics, is referred to hereinafter as the power electronics. The power electronics are connected in parallel with the capacitor 5. FIG. 2 furthermore reveals a first connection terminal 9 and a second connection terminal 10, wherein the first connection terminal 9 is connected to the emitter of the controllable power semiconductor 7 and simultaneously to the anode of the diode 8 that is connected in the opposite sense and is assigned to said power semiconductor, that is to say in other words to their junction point. The second connection terminal 10 is connected to the junction point of the controllable power semiconductors 7 and to the junction point of the diodes 8 that are connected in the opposite sense. If the controllable power semiconductor 7 arranged between the connection terminals 9 and 10 is in its on-state position, the voltage zero is dropped at the connection terminals 9 and 10. If, by contrast, said power semiconductor is in its off-state position but the controllable power semiconductor 7 that is not arranged between the connection terminals 9 and 10 is in its on-state position, the voltage present at the capacitor 5 is dropped between the connection terminals 9 and 10.

Figure 3:
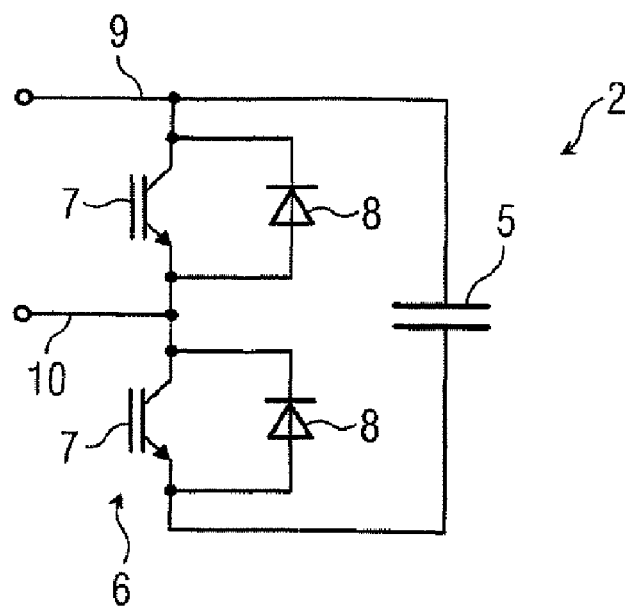
FIG. 3 shows an equivalent circuit diagram of an exemplary embodiment of a power semiconductor module according to the invention.

FIG. 3 shows an alternative configuration of the power semi-conductor module 2 in accordance with FIG. 2. In contrast to the variant of a Marquardt circuit as shown in FIG. 2, in FIG. 3 the first connection terminal 9 is connected to the collector of the turn-off power semiconductor 7 and to the cathode of the freewheeling diode 8 that is connected in the opposite sense and is in parallel therewith. The second connection terminal 10 is connected to the junction point of the turn-off power semiconductors 7 and of the freewheeling diodes 8. The exemplary embodiments of the Marquardt circuit that are shown in the figures are equivalent to one another and therefore have the same properties.

Figure 4:
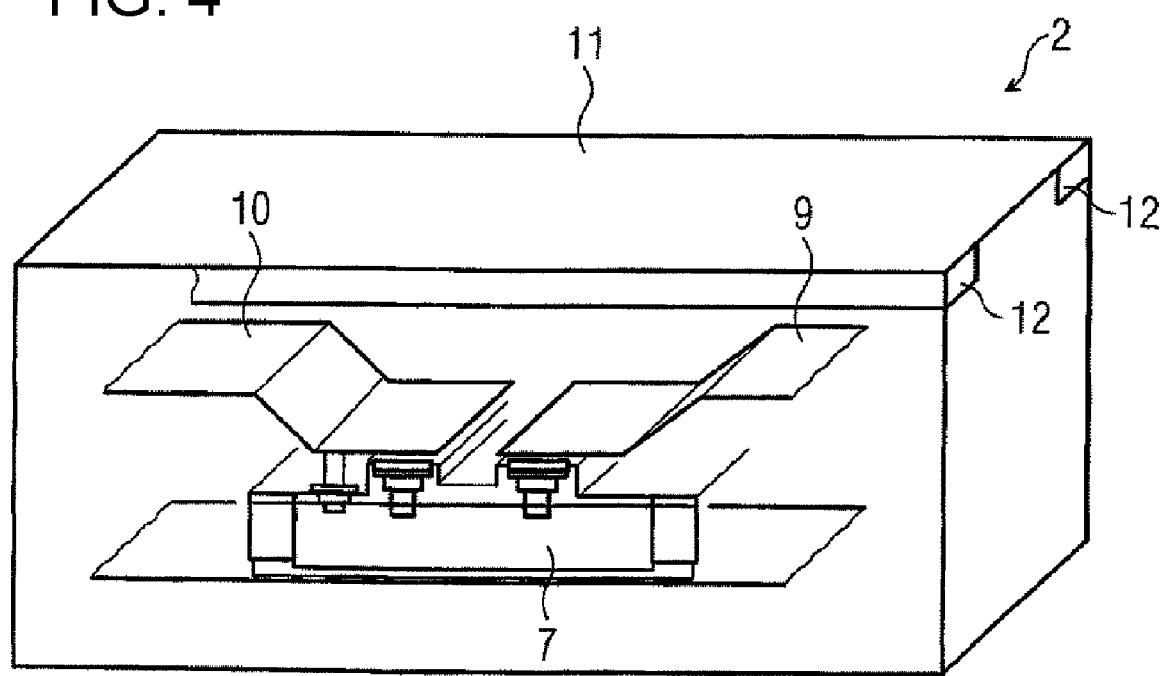
FIG. 4 shows an exemplary embodiment of a power semiconductor module according to the invention without an energy store.

FIG. 4 shows an exemplary embodiment of the power semiconductor module 2 according to the invention. It can be discerned that the power semiconductor module 2 has not only the controllable power semiconductors 7 and the connection terminals 9 and 10 but also a housing 11, which is composed of a metal, such as sheet steel, in the exemplary embodiment shown. Furthermore, two exhaust gas channels 12 are illustrated in the housing 11, said channels being partly open toward the connection terminals 9 and 10. In the event of an arc occurring in the housing 10, the hot gases are therefore led toward the outside through the exhaust gas channels 12, wherein the opening of the exhaust gas channels 12 is oriented in such a way that damage to components arranged outside the housing 11 can be reliably avoided. A metal foam having a large internal surface area is furthermore arranged in the exhaust gas channels 12 for the purpose of cooling the hot gases. In other words, the metal foam is open-pored, such that the hot gases or other explosion gases can flow through it. In this case, the large surface area gives rise to a large heat exchange area and to a large temperature exchange between the metal foam and the emerging hot gases, which are cooled in this way. Furthermore, the metal foam prevents particles from exiting, wherein pressure relief is additionally provided.

The invention claimed is:

1. A power semiconductor module for energy distribution, said power semiconductor module comprising:
    a housing having an exhaust gas channel for controlled leading away of hot gases and/or plasma in the event of an explosion, said exhaust gas channel guided in such a way, and its openings positioned in such a way, that emerging hot gases and/or plasma that have been led away cannot damage adjacent components or persons;
    a plurality of power semiconductor units, at least one power semiconductor disposed in said housing; and
    connection terminals disposed in said housing for connection of the power semiconductor module.

2. The power semiconductor module according to claim 1, wherein said exhaust gas channel is filled with a thermostable filler through which a flow can pass and which has a large internal surface area.

3. The power semiconductor module according to claim 2, wherein said thermostable filler is produced from ceramic.

4. The power semiconductor module according to claim 2, wherein said thermostable filler is a metal foam.

5. The power semiconductor module according to claim 4, wherein said metal foam is an open-pored metal foam.

6. The power semiconductor module according to claim 2, wherein said thermostable filler is a metal wool.

7. The power semiconductor module according to claim 1, wherein said housing is a plastic housing or a metal housing.

8. The power semiconductor module according to claim 1, wherein said at least one power semiconductor is at least one turn-off power semiconductor.

9. The power semiconductor module according to claim 1, which further comprises:
    a first connection terminal and a second connection terminal of said connection terminals;
    an energy storage device;
    a power semiconductor branch connected in parallel with said energy storage device;
    said at least one power semiconductor including first and second series-connected controllable power semiconductors of said power semiconductor branch;
    first and second reverse-acting freewheeling diodes respectively connected in parallel to said first and second controllable power semiconductors;
    a junction point between an emitter of said first controllable power semiconductor and an anode of said first reverse-acting freewheeling diode connected to said first controllable power semiconductor, forming said first connection terminal; and
    a junction point between an emitter of said second controllable power semiconductor and an anode of said second reverse-acting freewheeling diode connected to said second controllable power semiconductor, forming second connection terminal.

10. The power semiconductor module according to claim 1, which further comprises:
    a first connection terminal and a second connection terminal of said connection terminals;
    an energy storage device;
    a power semiconductor branch connected in parallel with said energy storage device;
    said at least one power semiconductor including first and second series-connected controllable power semiconductors of said power semiconductor branch;
    first and second reverse-acting freewheeling diodes respectively connected in parallel to said first and second controllable power semiconductors;
    a junction point between a collector of said first controllable power semiconductor and a cathode of said first reverse-acting freewheeling diode connected to said first controllable power semiconductor, forming said first connection terminal; and
    a junction point between a collector of said second controllable power semiconductor and a cathode of said second reverse-acting freewheeling diode connected to said second controllable power semiconductor, forming second connection terminal.

11. A converter valve branch, comprising a series circuit of power semiconductor modules according to claim 1.

12. A converter, comprising a bridge circuit including converter valve branches each having a series circuit of power semiconductor modules according to claim 1.

13. A power semiconductor module for energy distribution, said power semiconductor module comprising:
    a housing having an exhaust gas channel for controlled leading away of hot gases and/or plasma in the event of an explosion;
    a plurality of power semiconductors units, all electronic components of said plurality of power semiconductor units disposed in said housing; and
    connection terminals disposed in said housing for connection of the power semiconductor module.

* * * * *